United States Patent [19]

Kameyama et al.

[11] 4,433,470

[45] Feb. 28, 1984

[54] METHOD FOR MANUFACTURING SEMICONDUCTOR DEVICE UTILIZING SELECTIVE ETCHING AND DIFFUSION

[75] Inventors: Shuichi Kameyama, Yokohama; Koichi Kanzaki, Kawasaki; Yoshitaka Sasaki, Yokohama, all of Japan

[73] Assignee: Tokyo Shibaura Denki Kabushiki Kaisha, Japan

[21] Appl. No.: 378,480

[22] Filed: May 14, 1982

[30] Foreign Application Priority Data

May 19, 1981 [JP] Japan ................... 56-75185
May 19, 1981 [JP] Japan ................... 56-75186
May 19, 1981 [JP] Japan ................... 56-75188

[51] Int. Cl.³ .................. H01L 21/225; H01L 21/302
[52] U.S. Cl. .................... 29/577 C; 29/578; 29/580; 29/591; 148/174; 148/175; 148/187; 148/188; 156/628; 156/647; 156/649; 156/657; 357/35; 357/50; 357/59; 357/92
[58] Field of Search ............ 29/577 C, 578, 580, 29/591; 148/174, 175, 187, 188; 156/628, 647, 649, 657; 357/35, 50, 59, 92

[56] References Cited

U.S. PATENT DOCUMENTS

| | | | |
|---|---|---|---|
| 4,198,648 | 4/1980 | Nishizawa | 357/92 X |
| 4,284,997 | 8/1981 | Nishizawa | 357/92 X |
| 4,318,751 | 3/1982 | Horng | 148/175 X |
| 4,333,227 | 6/1982 | Horng et al. | 29/580 |
| 4,338,138 | 7/1982 | Cavaliere et al. | 29/580 X |
| 4,338,618 | 7/1982 | Nishizawa | 357/92 X |
| 4,378,630 | 4/1983 | Horng et al. | 29/580 |
| 4,398,338 | 8/1983 | Tickle et al. | 29/577 C X |

OTHER PUBLICATIONS

Berger et al., "Investigation of Intrinsic Delay . . . MTL/I²L", IEEE J. Solid-State Circuits, vol. SC-14, No. 2, Apr. 1979, pp. 327–336.

Primary Examiner—W. G. Saba
Attorney, Agent, or Firm—Finnegan, Henderson, Farabow, Garrett & Dunner

[57] ABSTRACT

A method of manufacturing a semiconductor device wherein grooves are formed between vertical type-npn transistors and insulating oxide layers are formed on the bottoms of the grooves, thereby preventing parasitic p-n junctions, which is characterized in that said grooves are formed by using as a mask a conductive pattern containing an impurity for forming an impurity region or by using as a mask an insulating film formed by the annealing of the conductive pattern.

9 Claims, 33 Drawing Figures

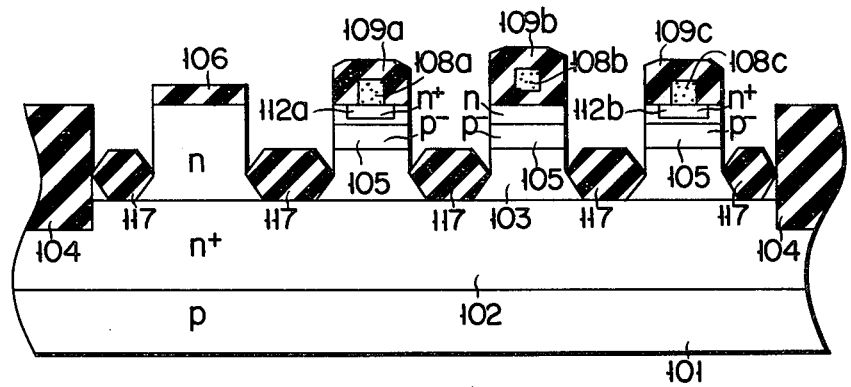
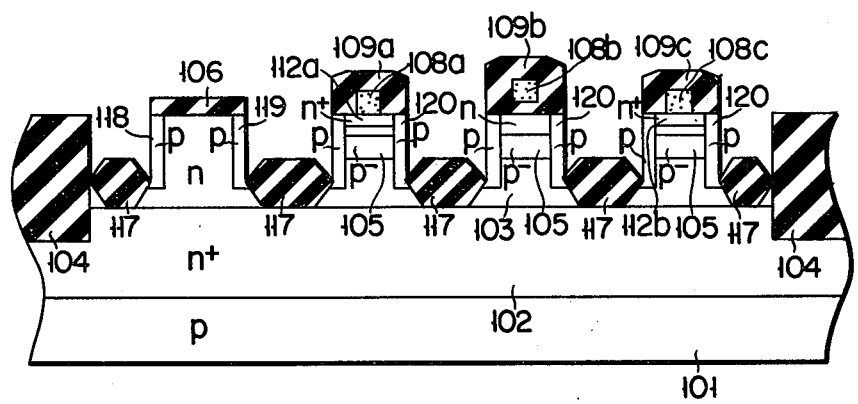
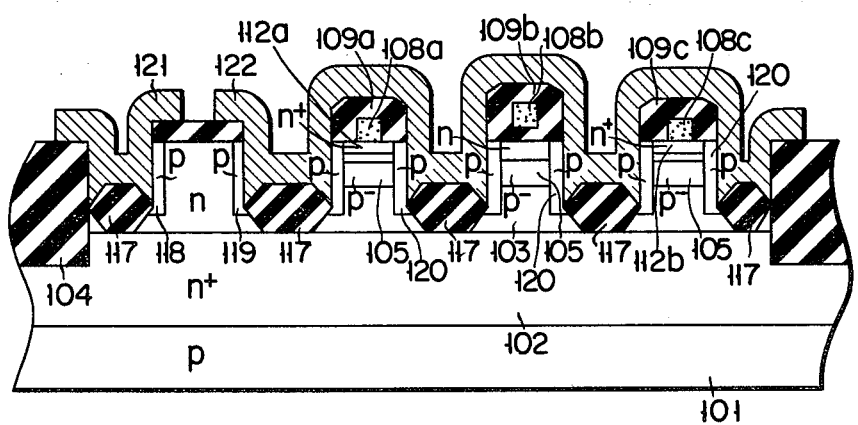

METHOD FOR MANUFACTURING SEMICONDUCTOR DEVICE UTILIZING SELECTIVE ETCHING AND DIFFUSION

BACKGROUND OF THE INVENTION

The present invention relates to a method for manufacturing a semiconductor device and, more particularly, to a method for manufacturing a bipolar integrated circuit with I²L elements.

An I²L (Integrated Injection Logic) is a logic element which has a composite structure involving a vertical transistor (e.g., an npn transistor) of inverted structure and a lateral transistor (e.g., pnp transistor) of complementary structure to that of the vertical transistor. In an I²L of the structure as described above, the lateral transistor serves as an injector for injecting charge to the base of the vertical transistor of the inverted structure, and the vertical transistor of the inverted structure serves as an inverter. For this reason, an I²L is receiving a lot of attention as a logic element which has a small logic amplitude and which is capable of operating at high speed and with low power consumption. Since the element isolation between the vertical and lateral transistors is unnecessary, an I²L can achieve a high integration and is suitable for large scale integration. Furthermore, since an I²L involves bipolar process technique, other bipolar circuits such as a linear circuit or an ECL (Emitter Coupled Logic) may be easily formed on the same chip, thus realizing a multi-functional integrated circuit.

Various studies have been made to achieve higher operation speed of the I²L. It has been recently pointed out that it is important to achieve a short storage time or a time required for a switching transistor to sink the minority carriers stored at an emitter or base region of a switching transistor of the next stage. This is described, for example, in IEEE Journal of Solid-State Circuits, Vol. SC-14. No. 2, April 1979, pp. 327 to 336. In order to eliminate storage of minority carriers, it is effective to optimize the concentration profile of the epitaxial semiconductor layer and the emitter region as well as to minimize the size of a region at which the minority carriers are stored. In view of this, it has been conventionally proposed to manufacture an I²L by a method to be described in FIGS. 1(a) to 1(c). According to this conventional method, referring to FIGS. 1(a) to 1(c), an n+-type buried layer 2 is selectively formed in a p-type silicon substrate 1. After growing an n-type epitaxial layer 3 on the substrate 1, a thick field oxide film 4 for element isolation is formed by selective oxidation. After selectively forming a silicon oxide film 5 on the prospective element forming region by the CVD process or photolithography, boron is thermally diffused using the silicon oxide film 5 as a mask to form a p+-type base region 6 and a p+-type injector 7 (FIG. 1(a)). In the next step, an arsenic-doped polycrystalline silicon film (arsenic is an n-type impurity) is deposited over the entire surface of the structure. The arsenic-doped polycrystalline silicon film is selectively etched to form polycrystalline silicon patterns 8a and 8b on collector region forming regions (FIG. 1(b)). Thermal oxidation under heating is performed to grow a thick thermal oxide film 9 around the polycrystalline patterns 8a and 8b and to grow a thin thermal oxide film 10 on the p+-type injector 7. Arsenic doped in the polycrystalline silicon patterns 8a and 8b is diffused into the p+-type base region 6 to form n+-type collector regions 11a and 11b. The thin thermal oxide film 10 is etched to provide the polycrystalline silicon patterns 8a and 8b as collector electrodes 12a and 12b. After an aluminum film is deposited over the entire surface of the structure, the aluminum film on the field oxide film 4 and the silicon oxide film 5 is patterned to form a base electrode 13 and an injector electrode 14. An integrated circuit including an I²L is thus completed (FIG. 1(c)). Referring to FIGS. 1(a) to 1(c), reference numerals 15a to 15c denote base contact holes, and reference numeral 16 denotes an injector contact hole.

In the conventional method for manufacturing an integrated circuit with an I²L described above, the base contact holes can be formed by self-alignment with respect to the collector electrodes 12a and 12b, so that the base electrode 13 may be able to contact with the base region 6 with a wider area. Moreover, the contact area of the base region 6 may be made smaller than the total area of the collector regions 11a and 11b. An I²L thus manufactured is capable of high speed operation and the ratio of the collector area to the base area (SC/SB) is increased. Therefore, the current amplification factor ($h_{FE}$) can be improved and higher integration can also be achieved. However, with an I²L of the structure as described above, the p-n junction below the base contact holes 15a to 15c of the npn transistors becomes parasitic to the p-n junctions of the base and emitter immediately below the collector regions 11a and 11b, as shown in FIG. 1(c). A parasitic p-n junction degrades the ratio (SC/SB) of the npn transistor for the dc operation. Then, the current amplification factor and the fanout of the npn transistor are reduced. Furthermore, during the switching operation, the minority carriers are stored in the n-type epitaxial layer of the parasitic diode, resulting in an increase in the diffusion capacitance and degradation in the operating speed of the I²L gate.

In order to prevent formation of a parasitic junction as described above, an I²L of a structure is proposed wherein silicon oxide layers 17a to 17c are buried below the base contact holes 15a to 15c of the npn transistor as shown in FIG. 2. Another silicon oxide layer 17d is also buried below the injector contact hole 16. With the I²L of this structure, the formation of a parasitic p-n junction can indeed be prevented. However, this structure simultaneously brings about defects to be described below in the manufacturing method therefor.

(1) The silicon oxide layers 17a to 17d are formed in the surface layer of the n+-type buried layer 2. However, when the n-type epitaxial layer 3 is grown thereafter, the silicon oxide layers 17a to 17d and the surrounding semiconductor layer tend to be converted into polycrystalline silicon. This adversely affects the characteristics of the transistor formed in the vicinities of the silicon oxide layers 17a to 17d.

(2) Since the p+-type base region 6 of the npn transistors must be in contact with the silicon oxide layers 17a to 17c, the thickness of the n-type epitaxial layer 3 is limited to the depth of the base region 6.

(3) Alignment of the silicon oxide layers 17a to 17c with the polycrystalline silicon patterns 8a and 8b as the diffusion sources for the collector regions 11a and 11b of the npn transistors requires the use of a mask. Thus, the silicon oxide layers 17a to 17c cannot be self-aligned with the collector regions 11a and 11b, resulting in lower integration.

Due to these defects, the conventional method for burying the silicon oxide layers and for forming the epitaxial layer thereon to form an I$^2$L gate is subject to structural and performance problems.

As a method for forming an intrinsic npn transistor with the silicon oxide layers for preventing formation of a parasitic p-n junction, it is possible to grow an intrinsic transistor forming region by the selective epitaxial growth method. However, at the current stage, the selective epitaxial growth method is not necessarily suitable for mass production.

SUMMARY OF THE INVENTION

The present invention has been made in consideration of this and has for its object to provide a method for manufacturing a semiconductor device or a bipolar semiconductor device such as an I$^2$L, which allows easy mass production of semiconductor devices while preventing formation of parasitic p-n junctions without adversely affecting the crystal structure of the epitaxial layer and without imposing a limit on the depth of the base region of the npn transistor.

In order to achieve the above and other objects of the present invention, there is provided a method for manufacturing a semiconductor device comprising the steps of:

(i) forming, in a surface layer or inside a semiconductor layer of first conductivity type, a first impurity region of second conductivity type, and thereafter forming a second impurity region of first conductivity type within said first impurity region or in part of said semiconductor layer on said first impurity region;

(ii) etching part of said semiconductor layer excluding part thereof on at least said second impurity region to at least a depth of said first impurity region to form a semiconductor region, said semiconductor region including said first and second impurity regions and having a projecting shape with vertical or substantially vertical side surfaces, thus defining an etched part;

(iii) selectively forming an insulating film on a bottom surface of the etched part; and (iv) forming an electrode on said semiconductor region, said electrode being connected to said first impurity region through the side surfaces of said semiconductor region;

wherein step (i) for forming said second impurity region comprises depositing, on part of said semiconductor layer on said first impurity region, a conductive pattern containing an impurity of first conductivity type to serve as an impurity diffusion source for said second impurity region and an electrode for said second impurity region, and performing an insulating treatment such as annealing; and step (ii) for etching the part of said semiconductor layer excluding the part on at least said second impurity region comprises etching the first mentioned part using said conductive pattern or an insulating film formed by the insulating treatment of the conductive pattern as a mask.

According to the method of the present invention, the first impurity region of second conductivity type may be formed in the semiconductor layer of first conductivity type by thermal diffusion, ion-implantation or the like. In the thermal diffusion method, a glass layer containing an impurity of second conductivity type is formed on a desired region of the semiconductor layer and thermal diffusion is performed using the glass layer as a diffusion source. In the ion-implantation method, an impurity of second conductivity type is selectively ion-implanted. If the ion-implantation method is adopted, the first impurity region can be formed in part of the semiconductor layer.

In order to form the second impurity region of first conductivity type within the first impurity region or in part of the semiconductor layer on the first impurity region, after masking parts of the structure excluding the part for forming the second impurity region, an impurity of first conductivity type may be ion-implanted or thermally diffused. However, it is preferable to selectively and directly-form a conductive pattern containing an impurity of first conductivity type on the second impurity region forming part and to perform thermal diffusion using the conductive pattern as a diffusion source. The conductive pattern formed by this method can be used as an electrode for the second impurity region. This conductive pattern may be directly formed on the semiconductor layer part corresponding to the second impurity region or may be formed on the semiconductor layer part corresponding to the first impurity region through an insulating film. If the conductive pattern is formed by the latter method, it may be used as a jumper wire. The conductive layer may be made of polycrystalline silicon containing an impurity of first conductivity type; metal silicides containing an impurity of first conductivity type such as molybdenum silicide, tungsten silicide, or tantulum silicide; or the like.

In order to selectively etch the parts of the semiconductor layer excluding at least the part corresponding to the second impurity region, these parts may be masked with a resist pattern or the like and may be etched by anisotropic etching. However, it is preferable to etch these parts using the conductive pattern as a mask. When this method is adopted, the second impurity region may be self-aligned with the etched part.

Etching in step (ii) may be performed in two different substeps. In the first substep, parts of the semiconductor layer excluding at least the part corresponding to the second impurity region are selectively etched to a depth nearly equal to that of the second impurity region to form a semiconductor region of projecting shape with vertical or substantially vertical side surfaces. After forming an insulating film on the etched surface of the semiconductor layer, the part of the insulating film on the bottom surface of the etched part of the semiconductor layer is removed to leave the insulating film only on the side surfaces of the etched part. Using the remaining insulating film as a mask, the exposed bottom surface of the etched part is further etched to the depth of the first impurity region to form one or more semiconductor regions including the first and second impurity regions and having a projecting shape with vertical or substantially vertical side surfaces.

Etching in step (ii) may be performed before or after an insulating treatment e.g. annealing of the conductive pattern.

In the semiconductor region including the first and second impurity regions formed by selective etching, the first and second impurity regions are exposed to its side walls. Thus, during subsequent formation of the electrode for the first impurity region, the first and second impurity regions may be short-circuited. In order to prevent this short-circuiting, after forming the semiconductor region, the second impurity region can be covered with an insulating film. For example, low temperature thermal oxidation is performed after forming the semiconductor region by etching using the conductive pattern containing an impurity of first conductivity type as a mask. Thus, thick oxide films are formed on the side surfaces of the conductive pattern and on the exposed side surfaces of the second impurity region below the side surfaces of the conductive pattern. Simultaneously, a thin oxide film is formed on the exposed surface of the first impurity region of the semiconductor region. This is accomplished by utlizing the fact that the oxidation rate of the conductive pattern and the second impurity region below the side surfaces of the conductive pattern is greater than that of the first impurity region in the semiconductor region. Thereafter, the thin oxide film is etched to selectively form an insulating film on the exposed surfaces (side surfaces) of the second impurity region in the semiconductor region. In other words, the contact hole of the first impurity region in the semiconductor region may be formed by self-alignment.

According to the present invention, in order to selectively form the oxide film only on the bottom surfaces of the etched parts in step (ii) by thermal oxidation, an antioxidant insulating film must be selectively formed on the side surfaces of the semiconductor region. This antioxidant insulating film is formed so as to serve as a mask during selective formation of an oxide film on the bottom surfaces of the etched parts during thermal oxidation and to prevent formation of an oxide film on the side surface of the first impurity region which is in contact with the electrode. The antioxidant insulating film may be, for example, a silicon nitride film, an alumina film or the like. This antioxidant insulating film is removed prior to formation of the electrode in step (iv).

The electrode for the first impurity region which is formed after removal of the antioxidant insulating film may include aluminum; aluminum alloys such as Al-Cu, Al-Si, or Al-Si-Cu; metals such as Mo, W, Ta, or Pt; metal silicides of these metals; or the like. Alternatively, it is also possible to diffuse an impurity of the conductivity type same as that of the first impurity region into the exposed surface of the semiconductor region after removal of the antioxidant insulating film and before formation of the electrode. If an impurity region of second conductivity type is formed on the exposed part of the side surface of the semiconductor region, short-circuiting between the first and second impurity regions or between the first impurity region and the semiconductor layer of first conductivity type upon formation of the electrode for the first impurity region may be prevented.

BRIEF DESCRIPTION OF THE DRAWINGS

FIGS. 3(a) to 3(i) are sectional views showing steps of a method for manufactirng an I$^2$L, according to an embodiment of the present invention;

DETAILED DESCRIPTION OF THE PREFERRED EMBODIMENTS

Figure 1A:
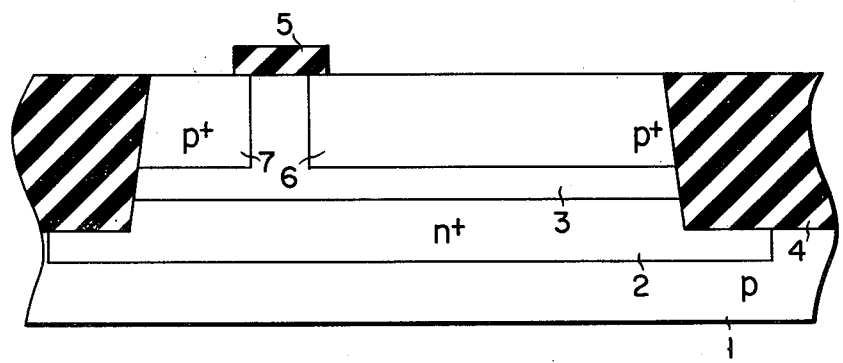
FIGS. 1(a) to 1(c) are sectional views showing steps of a conventional method for manufacturing an I$^2$L.
Figure 1B:
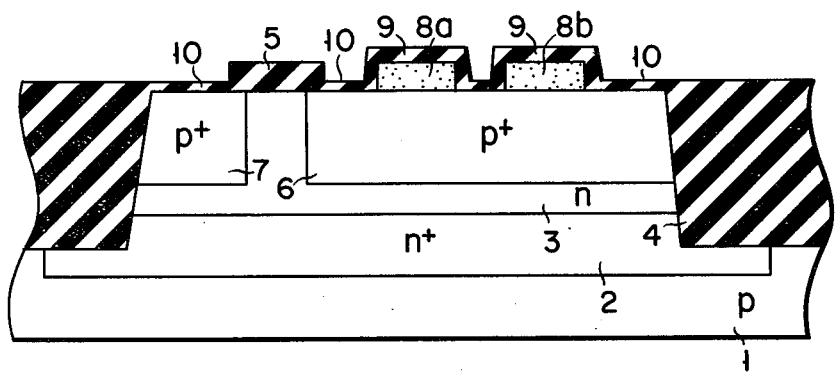
Figure 1C:
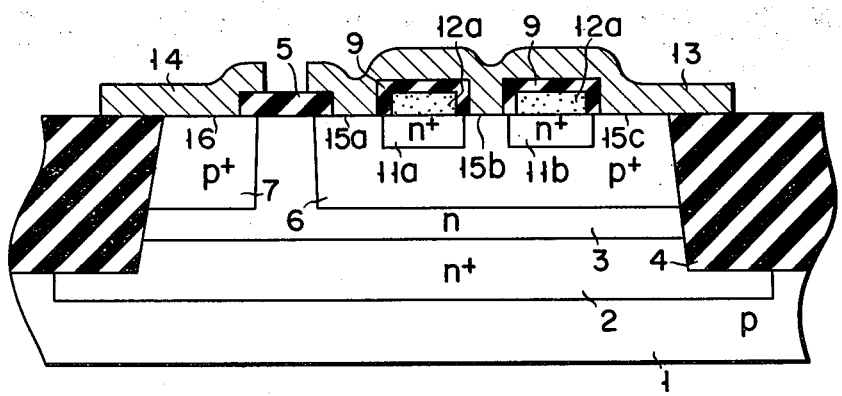
Figure 2:
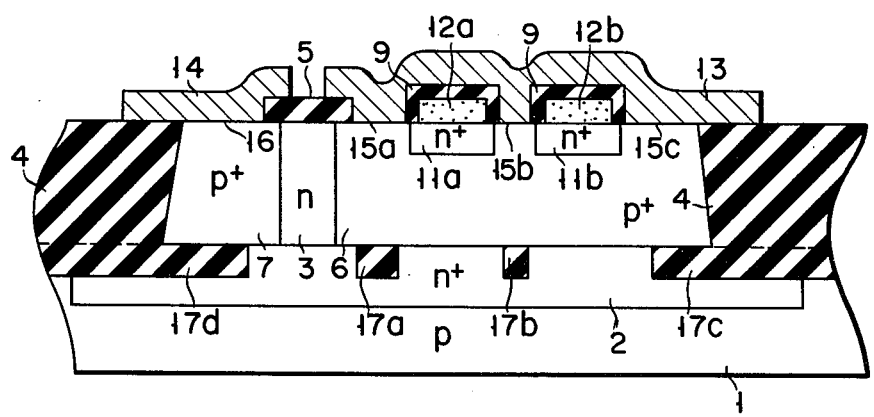
FIG. 2 is a sectional view of an I$^2$L manufactured by an improved conventional method.

A method of the present invention as applied to manufacture of an I$^2$L will now be described in detail with reference to FIGS. 3(a) to 3(i).

Example 1

(i) Antimony was selectively diffused in a p-type silicon substrate 101 to form an n$^+$-type buried layer 102 therein. After growing an n-type silicon epitaxial layer 103 (semiconductor layer of first conductivity type), a field oxide film 104 was formed around a prospective region for forming an I$^2$L gate. A p$^-$-type base region 105 (first impurity region of second conductivity type) for intrinsic npn transistors is formed at part of the inside of the silicon epitaxial layer 103 by ion-implantation or the like. The p$^-$-type base region 105 may alternatively be formed by diffusing the impurity from the surface of the n-type silicon epitaxial layer 103. Thermal oxidation and selective etching were then performed to form a silicon oxide film 106 covering the base region of a pnp transistor and to form a silicon oxide film 107 covering part of the p$^-$-type base region 105. The silicon oxide film 107 for insulating a jumper wire may be formed thick in the same step for forming the field oxide film 104. Thereafter, an n$^+$-type polycrystalline silicon film 108 doped with arsenic which is an n-type impurity, a CVD-SiO$_2$ film 109, and a silicon nitride film 110 were formed in the order named (FIG. 3(a)).

(ii) Resist patterns (not shown) were formed on the silicon nitride film 110 by photolithography. Using these resist patterns as a mask, the silicon nitride film 110 was etched to form silicon nitride film patterns 110a to 110c. Using these patterns 110a to 110c as a mask, the CVD-SiO$_2$ film 109 was patterned to form CVD-SiO$_2$ film patterns 109a to 109c. Using the silicon nitride film patterns 110a to 110c as a mask, the n$^+$-type polycrystalline silicon film 108 was etched by reactive ion etching or with an etchant containing HF, HNO$_3$ and CH$_3$COOH in a ratio of 1:3:8. Upon this etching, n$^+$-type polycrystalline silicon patterns 108a and 108c (conductive patterns) were formed which were in direct contact with part of the n-type silicon epitaxial layer 103 on the p$^-$-type base region 105 and ends of which extended over the field oxide film 104. Simultaneously, an n$^+$-type polycrystalline silicon pattern 108b was formed which was arranged on the silicon epitaxial layer 103 through the silicon oxide film 107 and ends of which extended over the silicon oxide film 104 (FIG. 3(b)).

Figure 3A:
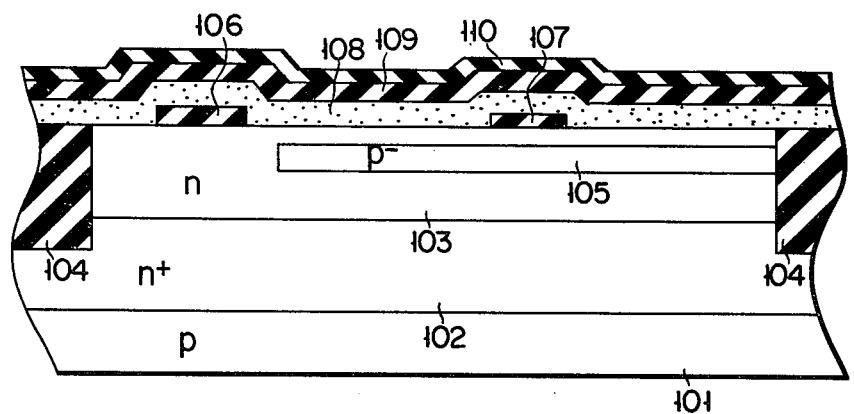
Figure 3B:
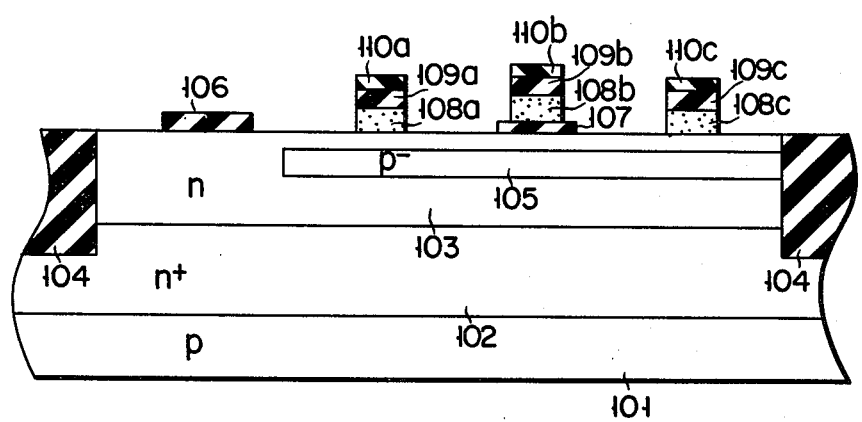
Figure 3C:
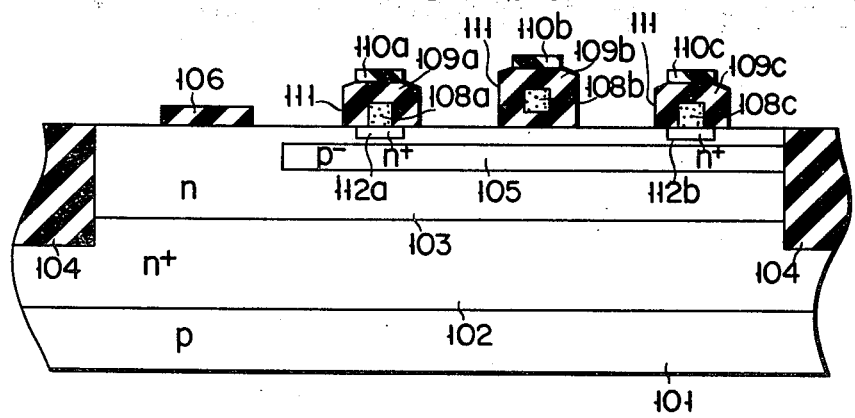

(iii) Annealing was performed in a low-temperature steam or wet atmosphere at 700° to 900° C. The oxidation rate of the n$^+$-type polycrystalline silicon patterns 108a to 108c is 4 to 10 times that of the n-type silicon epitaxial layer 103. For this reason, as shown in FIG. 3(c), a thick thermal oxide film 111 was formed over the exposed side surfaces of the patterns 108a to 108c. At the same time, a thin thermal oxide film (not shown) was formed over the surface of the n-type silicon epitaxial layer 103. Upon annealing, arsenic in the n$^+$-type polycrystalline silicon patterns 108a and 108c which were in direct contact with the n-type silicon epitaxial layer 103 was diffused into the n-type silicon epitaxial layer 103 to form n$^+$-type collector regions 112a and 112b of the npn transistors. When these n$^+$-type collector regions 112a and 112b are formed, the n$^+$-type polycrystalline silicon patterns 108a and 108c serve as collector electrodes, and the n$^+$-type polycrystalline silicon pattern 108b on the silicon oxide film 107 serves as a jumper wire. The thin thermal oxide film on the n-type silicon epitaxial layer 103 was removed by treatment with ammonium fluoride, while leaving the thermal oxide films 111 around the n+-type polycrystalline silicon patterns 108a to 108c (FIG. 3(c)).

Figure 3D:
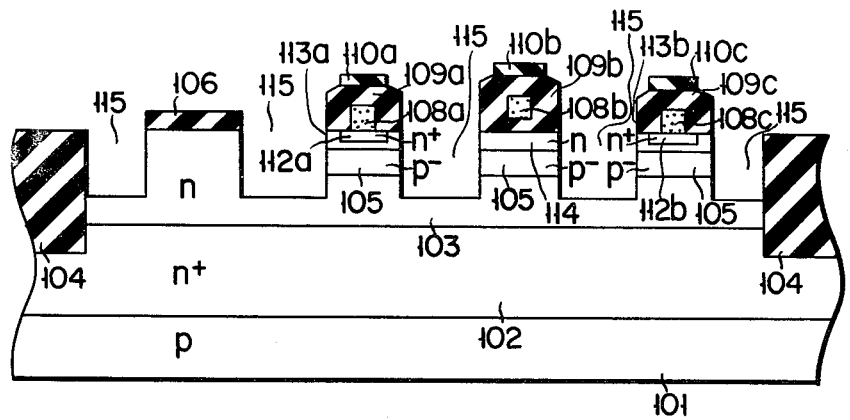

(iv) The n-type silicon epitaxial layer 103 which was exposed by the removal of the thin thermal oxide film in the previous step was then etched past the p−-type base region 105 by reactive ion using as a mask the field oxide film 104, the silicon oxide film 106, and the thermal oxide films 111 around the n+-type polycrystalline patterns 108a to 108c. Then, vertical npn transistors 113a and 113b of projecting shape with vertical side surfaces as shown in FIG. 3(d) were formed. Simultaneously, a projection 114 comprising the n-type silicon epitaxial layer 103 and the p−-type base region 105 was formed. By this etching, formation of a parasitic p-n junction was prevented, and the operation characteristics of the I²L were improved.

Figure 3E:
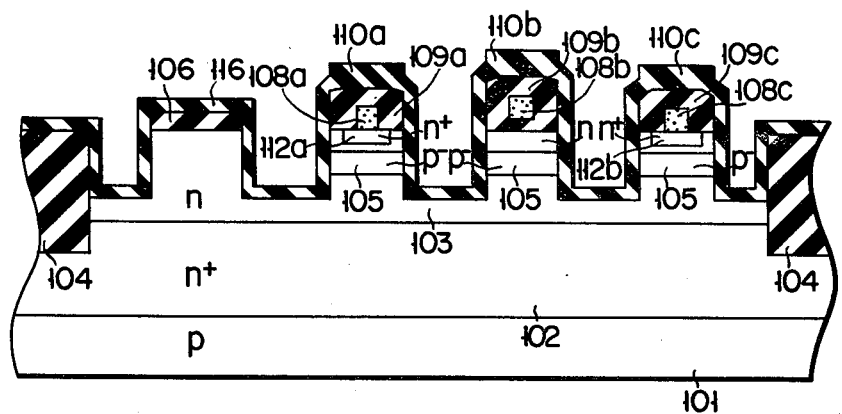
Figure 3F:
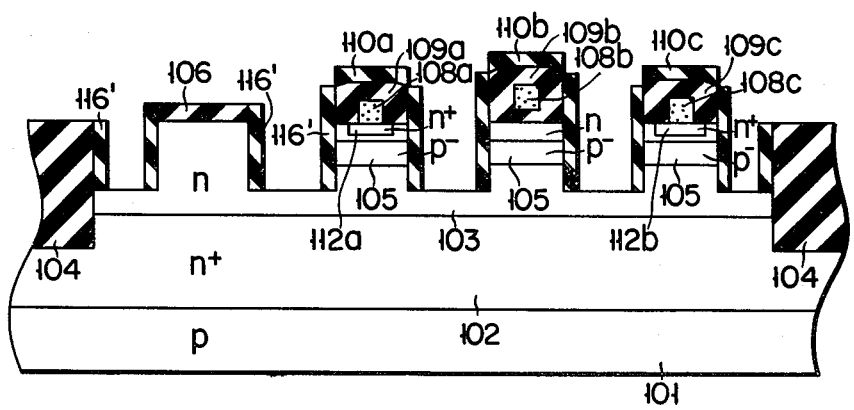

(v) A silicon nitride film 116 (FIG. 3(e)) was deposited over the entire surface of the structure 25 including etched parts 115. Etching was then performed by reactive ion etching for a time duration slightly longer than that required for entirely removing the silicon nitride film 116. Parts of the silicon nitride film 116 deposited on the side surfaces of the npn transistors 113a and 113b and so on have apparent thicknesses which are greater in the vertical direction than that at the flat part thereof. As is well known, reactive ion etching progresses only in the vertical direction of the substrate 101. For this reason, silicon nitride films 116' remained on the side surfaces of the npn transistors 113a and 113b, the projection 114 and so on. At the same time, parts of the bottom surfaces of the etched parts 115 were exposed. In order to leave these silicon nitride films efficiently, another method may be adopted. According to this method, in the state as shown in FIG. 3(d), the transistors 113a and 113b, the projection 114, and so on having vertical or substantially vertical side surfaces are formed by anisotropic etching such as reactive ion etching, thus defining the etched parts 115 with silicon side surfaces Silicon etching of about 1,000 to 2,000 Å is performed by isotropic etching. Then, the thermal oxide films 111 around the silicon patterns 108a to 108c were formed into overhangs. Then, by etching the silicon nitride film 116 with directivity such as reactive ion etching or the like in the next step, the silicon nitride film may be left on the side surfaces of the transistors 113a and 113b and the projection 114 below the overhangs. Furthermore, since the side surfaces of the projections are etched by isotropic etching, crystal defects which are caused by etching such as reactive ion etching of the side surfaces may be removed. Annealing was then performed in a steam or wet high-temperature atmosphere using as an antioxidant mask the silicon nitride patterns 110a to 110c and the silicon nitride films 116'. Thus, silicon oxide layers 117 were grown on the bottom surfaces of the etched parts 115 between the npn transistors 113a and 113b and so on (FIG. 3(g)). In order to achieve a uniform impurity profile in each impurity region of the silicon epitaxial layer 103, the silicon oxide layers 117 is preferably formed at a relatively low temperature by high-pressure oxidation or the like within a relatively short period of time. Finally, the silicon nitride films 116' and the silicon nitride patterns 110a to 110c were removed by phosphoric acid or the like (FIG. 3(g)).

(vi) Then, diffusion of boron or vapor phase diffusion of BN was carried out. As shown in FIG. 3(h), there were formed a p-type emitter region (injector) 118 and a collector region 119 of the pnp transistor; and p-type regions (base contact regions) 120 on the side surfaces of the npn transistors 113a and 113b and the projection 114. The p-type regions 120 extend to parts of the silicon epitaxial layer 103 below the p−-type base regions 105. However, since most parts of the p-type regions 120 are in contact with the silicon oxide layers 117, they do not form big p-n junctions and do not significantly affect the characteristics of the I²L. An aluminum film was then deposited over the entire surface of the structure by vapor deposition. The aluminum film was then patterned to form an injector electrode 121 connected to the p-type emitter region (injector) 118 and a base electrode 122 connected to the p−-type base region 105 through the p-type region. An I²L was thus manufactured (FIG. 3(i)).

According to Example 1 described above, various advantages as will be described below are obtained.

(1) The etched parts 115 extending through the p−-type base regions 105 are formed by a single etching operation, thus forming the npn transistors 113a and 113b therebetween. The silicon oxide layers 117 are formed on the bottom surfaces of the etched parts 115. Therefore, formation of p-n junctions parasitic to the p-n junctions between the bases and emitters of the npn transistors may be prevented, so that a high speed I²L may be manufactured.

(2) The silicon oxide layers 117 for preventing formation of the parasitic p-n junctions are formed by a single etching operation after formation of the silicon epitaxial layer 103 using the silicon nitride films 116' as a mask. For this reason, a conventional drawback of degradation in the characteristics of the transistors formed in the vicinities of the buried silicon oxide layers by the conventional method may be prevented.

(3) Conventionally, the thickness of the silicon epitaxial layer must be regulated to be the same as that of the base regions so that the buried silicon oxide layers may be brought into contact with the base regions of the npn transistors. This requirement is no longer imposed according to the present invention, so the device may be designed more easily.

(4) The n+-type collector regions 112a and 112b of the npn transistors are formed using the polycrystalline silicon patterns 108a and 108c as diffusion sources. The silicon oxide layers 117 are formed by etching using as a mask the thermal oxide films 111 around the polycrystalline silicon patterns 108a and 108c. For this reason, the polycrystalline silicon patterns 108a and 108c and the collector regions 112a and 112b may be formed by self-alignment, and an I²L of high integration may be manufactured.

(5) If the p-type regions (base contact regions) 120 are formed on the side surfaces of the npn transistors 113a and 113b by removing the silicon nitride films 116' and diffusing boron after formation of the transistors 113a and 113b, short-circuiting between the p−-type base regions 105 and the emitter regions (silicon epitaxial layers 103) and between the bases and collectors may be prevented.

Example 2

Figure 4A:
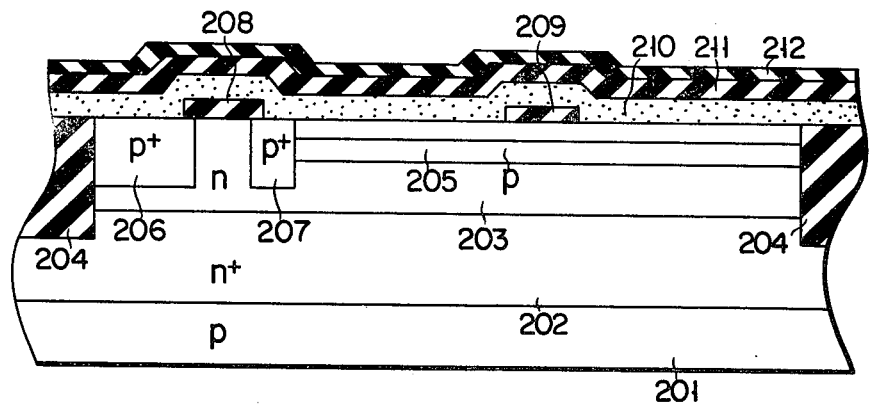
FIGS. 4(a) to 4(k) and FIGS. 5(a) to 5(h) are sectional views showing steps of methods for manufacturing an I$^2$L according to other embodiments of the present invention.

(i) Antimony was selectively diffused in a p-type silicon substrate 201 to form an n+-type buried layer 202 therein. After growing an n-type silicon epitaxial layer 203 (semiconductor layer of first conductivity type), a field oxide film 204 was formed around a prospective region for forming an I²L gate. A p⁻-type base region 205 (first impurity region of second conductivity type) of an intrinsic npn transistor was formed at part of the inside of the silicon epitaxial layer 203 by ion-implantation or the like. The p⁻-type base region 205 may alternatively be formed by diffusing the impurity from the surface of the n-type silicon epitaxial layer 203. Boron was selectively diffused to form a p⁺-type emitter region (injector) 206 and a p⁺-type collector region 207 of the pnp transistor. Thermal oxidation and selective etching were then performed to form a silicon oxide film 208 covering the base region of the pnp transistor and to form a silicon oxide film 209 covering part of the p⁻-type base region 205. The silicon oxide film 209 for insulating a jumper wire may be formed thick in the same step for forming the field oxide film 204. Thereafter, an n⁺-type polycrystalline silicon film 210 doped with arsenic which is an n-type impurity, a CVD-SiO₂ film 211, and a silicon nitride film 212 were formed in the order named (FIG. 4(a)).

(ii) Resist patterns (not shown) were formed on the silicon nitride film 212 by photolithography. Using these resist patterns as a mask, the silicon nitride film 212c was etched to form silicon nitride film patterns 212a to 212c. Using these patterns 212a to 212 as a mask, the CVD-SiO₂ film 211 was patterned to form CVD-SiO₂ film patterns 211a to 211c. Using the silicon nitride film patterns 212a to 212c as a mask, the n⁺-type polycrystalline silicon film 210 was etched by reactive ion etching or with an etchant containing HF, HNO₃ and CH₃COOH in a ratio of 1:3:8. Upon this etching, n⁺-type polycrystalline silicon patterns 210a and 210c (conductive patterns) were formed which were in direct contact with part of the n-type silicon epitaxial layer 203 on the p⁻-type base region 205 and ends of which extended over the field oxide film 204. Simultaneously, an n⁺-type polycrystalline silicon pattern 210b was formed which was arranged on the silicon epitaxial layer 203 through the silicon oxide film 209 and ends of which extended over the silicon oxide film 204 (FIG. 4(b)).

Figure 4B:
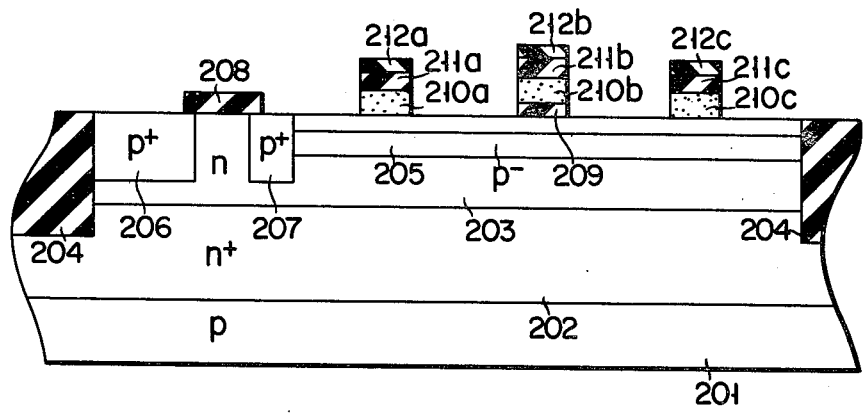
Figure 4C:
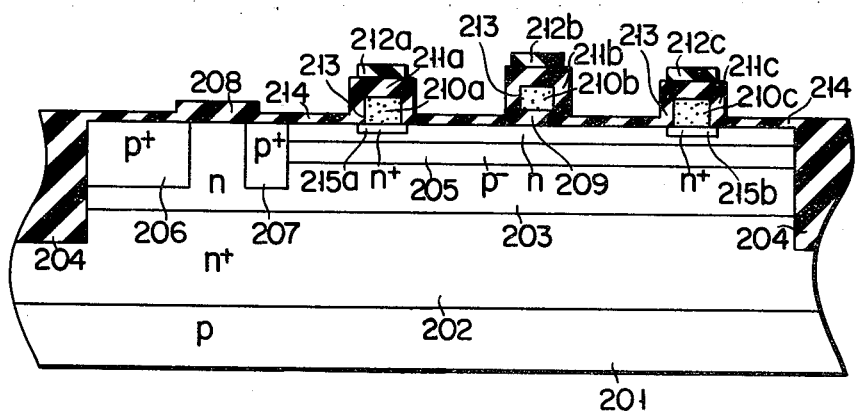

(iii) Annealing was performed in a low-temperature steam or wet atmosphere at 700° to 900° C. The oxidation rate of the n⁺-type polycrystalline silicon patterns 210a to 210c is 4 to 10 times that of the n-type silicon epitaxial layer 203, the emitter 206 and the collector 207. For this reason, as shown in FIG. 4(c), a thick thermal oxide film 213 was formed over the exposed side surfaces of the patterns 210a to 210c. At the same time, a thin thermal oxide film 214 was formed over the surface of the n-type silicon epitaxial layer 203. Upon annealing, arsenic in the n⁺-type polycrystalline silicon patterns 210a and 210c which were in direct contact with the n-type silicon epitaxial layer 203 was diffused into the n-type silicon epitaxial layer 203 to form n⁺-type collector regions 215a and 215b of the npn transistors. When these n⁺-type collector regions 215a and 215b are formed, the n⁺-type polycrystalline silicon patterns 210a and 210c serve as collector electrodes, and the n⁺-type polycrystalline silicon pattern 210b on the silicon oxide film 209 serves as a jumper wire.

Figure 4D:
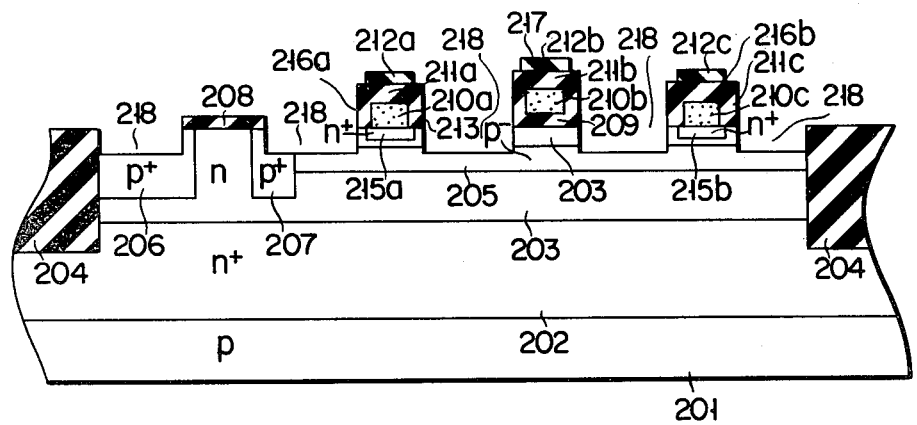

(iv) The thin thermal oxide film 214 was removed by treatment with ammonium fluoride, thereby leaving the thermal oxide films 213 around the n⁺-type polycrystalline silicon patterns 210a to 210c. The insulating films such as thermal oxide films may be deformed on the side surfaces of the polycrystalline silicon patterns 210a to 210c by other methods than that described above. For example, after forming an insulating film such as a CVD-SiO₂ film in a condition as shown in FIG. 4(b), anisotropic etching such as reactive ion etching may be performed. Then, by anisotropic etching, the insulating film such as the CVD-SiO₂ may be left on the vertical or substantially vertical side surfaces of the polycrystalline silicon patterns 210a to 210c. The n-type silicon epitaxial layer 203 which was exposed by the removal of the thin thermal oxide film 214 in the previous step was then etched by reactive ion etching using as a mask the field oxide film 204, the silicon oxide film 208, and the thermal oxide films 213 around the n⁺-type polycrystalline patterns 210a to 210c. Then, semiconductor regions 216a and 216b of projecting shape with vertical side surfaces as shown in FIG. 4(d) were formed. Simultaneously, a projection 217 comprising the n-type silicon epitaxial layer 203 and the p⁻-type base region 205 was formed. Formation of a parasitic p-n junction was prevented, and the operation characteristics of the I²L were improved. This first etching is performed for a distance which is determined by the structure of the semiconductor regions 216a and 216b. The insulating films for isolation between the n⁺-type collector regions 215a and 215b and the p-type regions as the base contacts are formed on the side surfaces of the semiconductor regions 216a and 216b. In a later step, the contact holes for the p⁻-type base regions 205 are formed. For this reason, etching must not be performed beyond the p⁻-type base regions 205 but to a depth equivalent to the n⁺-type collector regions 215a and 215b. If the first etching operation is performed too deep, continuity between the intrinsic regions of the npn transistors (projecting semiconductor regions) and the contact holes for the base contacts is adversely affected, resulting in an increase in the base resistance.

Figure 4E:
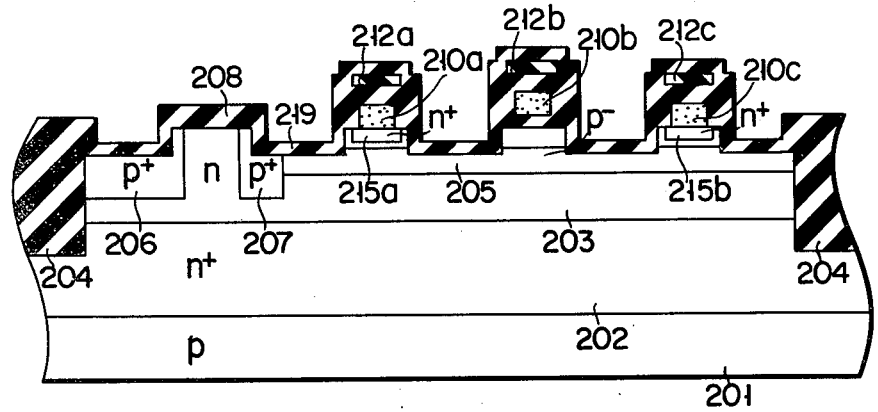
Figure 4F:
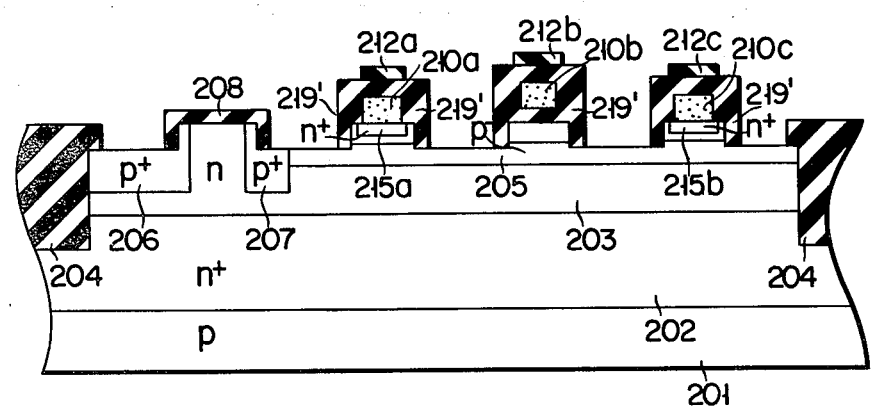

(v) In the next step, a thin CVD-SiO₂ film 219 was formed over the entire surface of the structure including etched parts 218, as shown in FIG. 4(e). The CVD-SiO₂ film 219 was etched by reactive ion etching. Since reactive ion etching progresses only in the vertical direction of the substrate 201, CVD-SiO₂ films 219' remained on the side surfaces of the semiconductor regions 216a and 216b and the projection 217, and the bottom surfaces of the etched parts 218 were exposed (FIG. 4(f)).

Figure 4G:
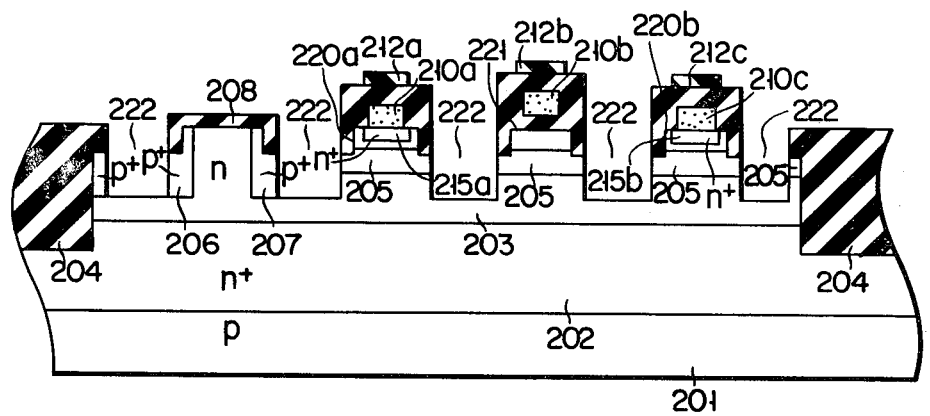

(vi) The exposed bottom surfaces of the etched parts 218 were etched (second etching) by reactive ion etching using as a mask the CVD-SiO₂ films 219' remaining on the field oxide film 204, the silicon oxide films 208, the semiconductor regions 216a and 216b, and the projection 217. Then, as shown in FIG. 4(g), vertical npn transistors 220a and 220b and a projection 221 with vertical side surfaces were formed. The second etching must be performed deeper than the p⁻-type base region 205. In this manner, formation of parasitic p-n junctions is prevented, and the operation characteristics of the I²L are improved.

Figure 4H:
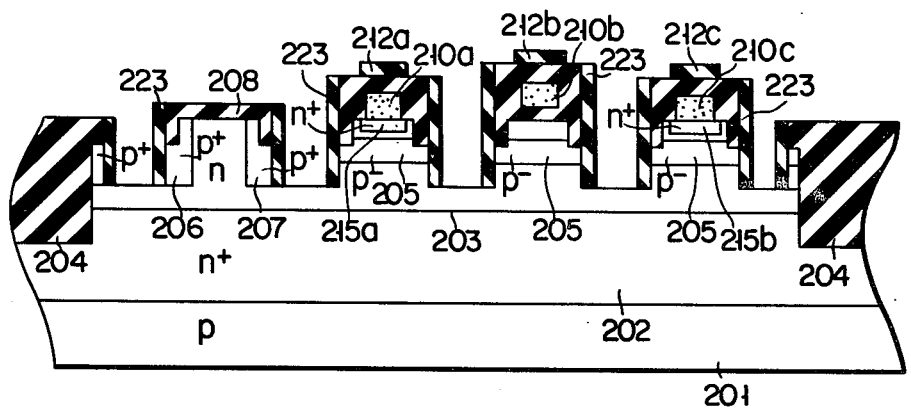
Figure 4I:
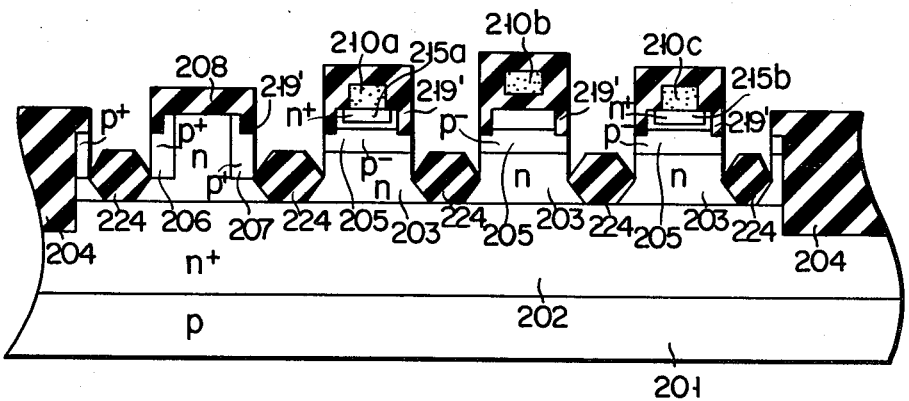

(vii) After depositing a silicon nitride film over the entire surface of the structure including etched parts 222, it was etched by reactive ion etching so as to leave silicon nitride films 223 on the side surfaces of the vertical npn transistors 220a and 220b and the projection 221 and to expose parts of the bottom surfaces of the etched parts 222 (FIG. 4(h)). Annealing was then performed in a steam or wet high-temperature atmosphere using as an antioxidant mask the silicon nitride patterns 212a to 212c and the remaining silicon nitride films 223. Thus, thick silicon oxide layers 224 were grown on the bottom surfaces of the etched parts 222 between the vertical npn transistors 216a and 216b and so on (FIG. 4(i)). Subsequently, the silicon nitride films 223 and the silicon nitride film patterns 212a to 212c were removed by hot phosphoric acid (FIG. 4(i)). It is preferable to form the silicon oxide layers 224 at a relatively low temperature within a short period of time by high-pressure oxidation or the like so as to obtain uniform impurity profile of each impurity region in the n-type silicon epitaxial layer 203.

Figure 4J:
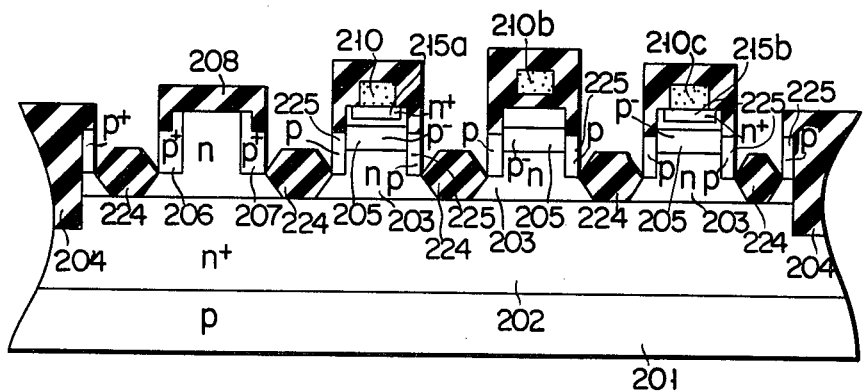
Figure 4K:
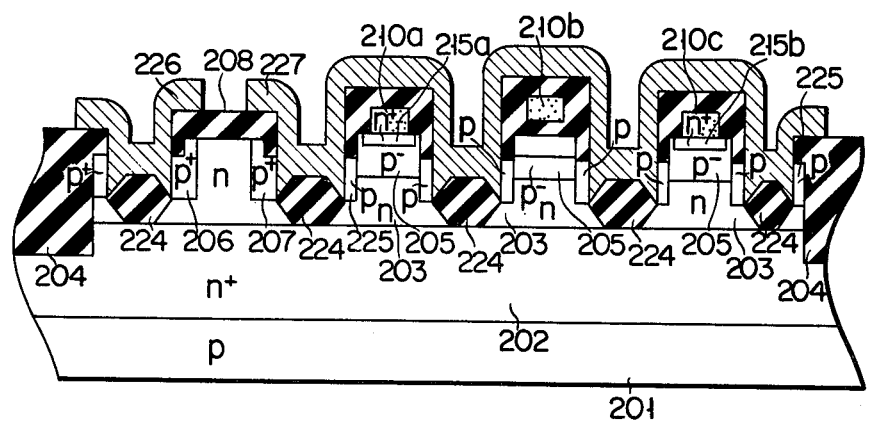

(viii) Diffusion of boron or vapor phase diffusion of BN was performed to form p-type regions 225 in the contact holes formed in the side surfaces of the vertical npn transistors 216a and 216b and the projection 217 (FIG. 4(j)). Since the n+-type collector regions 215a and 215b of the npn transistors 216a and 216b are separated from the surface of the p-type regions (the surface of the base contact regions) 225 by the CVD-SiO$_2$ films 219', a sufficient collector-base dielectric strength is obtained. Although the p-type regions 225 extend to parts of the n-type silicon epitaxial layers 203 below the p⁻-type base regions 205, they do not form big p-n junctions and do not significantly adversely affect the characteristics of the I$^2$L since most of the extended parts of the p-type regions 225 are in contact with the silicon oxide layers 224. Subsequently, an aluminum film was formed over the entire surface of the structure by vapor deposition and was patterned to form an injector electrode 226 which was in contact with the p+-type emitter region (injector) 206 and to form a base electrode 227 which was in contact with the p⁻-type base region 205. An I$^2$L was thus completed. (FIG. 4(k)).

With the I$^2$L manufactured in Example 2, the following advantages are obtained in addition to those obtained by that in Example 1.

According to the procedure of Example 2, etching is performed first to a depth equivalent to the collector regions 215a and 215b. After leaving the CVD-SiO$_2$ films 219' on the side surfaces of the semiconductor regions 216a and 216b, etching is performed a second time using these CVD-SiO$_2$ films 219' as a mask to form the vertical npn transistors 220a and 220b. For this reason, the p⁻-type base regions 205 are exposed to the side surfaces of the transistors 220a and 220b, and the n+-type collector regions 215a and 215b are sufficiently covered with the remaining CVD-SiO$_2$ films 219'. Thus, the collector-base dielectric strength can be improved. Even if the base electrode 227 is formed in this condition, short-circuiting between the collector and the base through the electrode 227 can be prevented.

Example 3

Figure 5A:
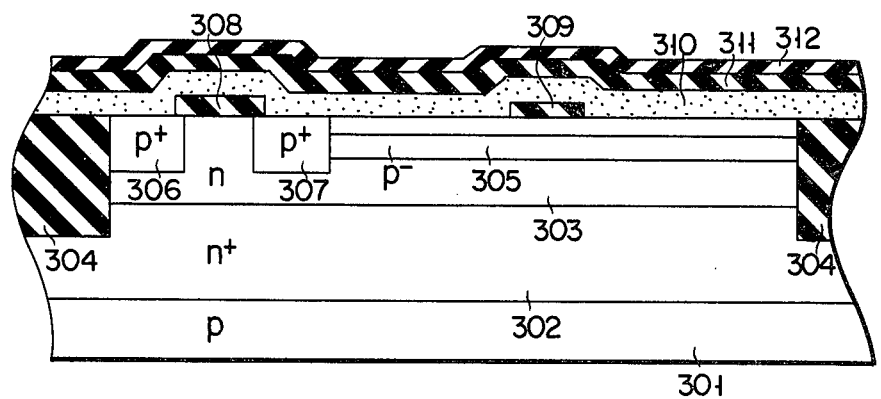
Figure 5B:
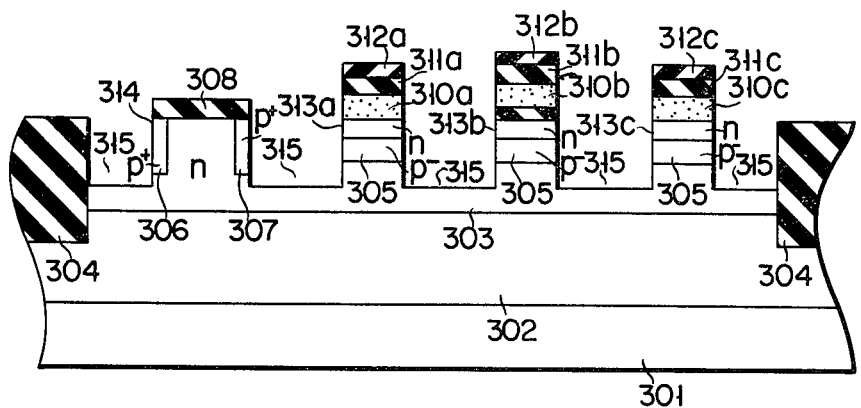

(i) Antimony was selectively diffused in a p-type silicon substrate 301 to form an n+-type buried layer 302 therein. After growing an n-type silicon epitaxial layer 303 (semiconductor layer of first conductivity type), a field oxide film 304 was formed around a prospective region for forming an I$^2$L gate. A p⁻-type base region 305 (first impurity region of second conductivity type) of an intrinsic npn transistor was formed at part of the inside of the silicon epitaxial layer 303 by ion-implantation or the like. The p⁻-type base region 305 may alternatively be formed by diffusing the impurity from the surface of the n-type silicon epitaxial layer 303. Boron was selectively diffused to form a p+-type emitter region 306 (injector) and a p+-type collector region 307 in the silicon epitaxial layer 303. Thermal oxidation and selective etching were then performed to form a silicon oxide film 308 covering the base region of a pnp transistor and to form a silicon oxide film 309 covering part of the p⁻-type base region 305. The silicon oxide film 309 for insulating a jumper wire may be formed thick in the same step for forming the field oxide film 304. Thereafter, an n+-type polycrystalline silicon film 310 doped with arsenic which is an n-type impurity, a CVD-SiO$_2$ oxide film 311, and a silicon nitride film 312 were formed in the order named (FIG. 5(a)).

(ii) Resist patterns (not shown) were formed on the silicon nitride film 312 by photolithography. Using these resist patterns as a mask, the silicon nitride film 312 was etched to form silicon nitride film patterns 312a to 312c. Using these patterns 312a to 312c as a mask, the CVD-SiO$_2$ film 311 was patterned to form CVD-SiO$_2$ film patterns 311a to 311c. Using the silicon nitride film patterns 312a to 312c as a mask, the n+-type polycrystalline silicon film 310 was etched by reactive ion etching or with an etchant containing HF, HNO$_3$ and CH$_3$COOH in a ratio of 1:3:8. Upon this etching, n+-type polycrystalline silicon patterns 310a and 310c (conductive patterns) were formed which were in direct contact with part of the n-type silicon epitaxial layer 303 on the p⁻-type base region 305 and ends of which extended over the field oxide film 304. Simultaneously, an n+-type polycrystalline silicon pattern 310b was formed which was arranged on the silicon epitaxial layer 303 through the silicon oxide film 309 and ends of which extended over the silicon oxide film 304. Subsequently, the p⁻-type base region 305 was etched by reactive ion etching using as a mask the silicon nitride film patterns 312a to 312c, the silicon oxide film 308 and the field oxide film 304. Then, semiconductor regions 313a to 313c and a projection 314 were formed. The semiconductor regions 313a to 313c were formed in self-alignment with the conductive patterns 310a to 310c and consisted of the epitaxial layers 303 and the p⁻-type base regions 305 with vertical side surfaces. The projection 314 had the p+-type emitter region 306 and the p+-type collector region 307. Formation of parasitic p-n junctions was prevented, and characteristics of the I$^2$L were improved.

Figure 5C:
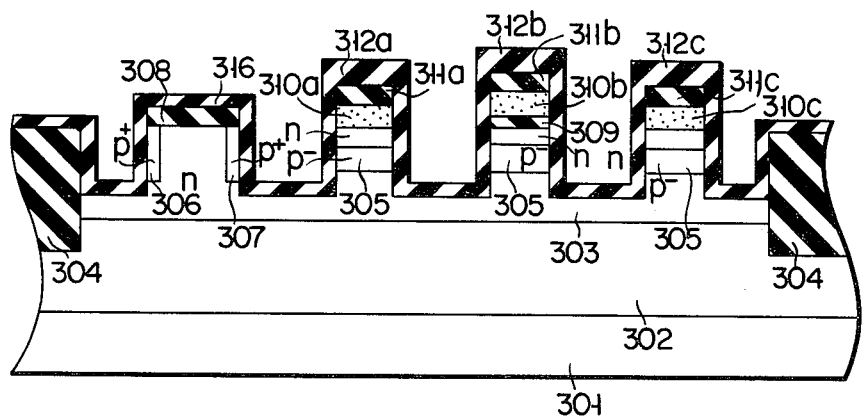
Figure 5D:
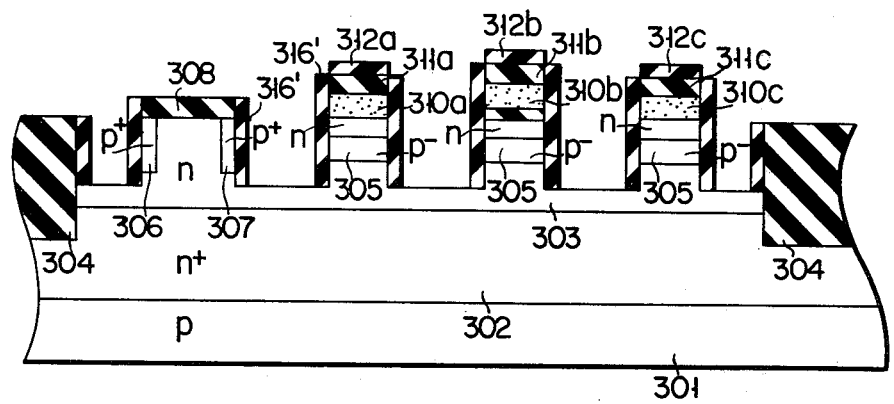
Figure 5E:
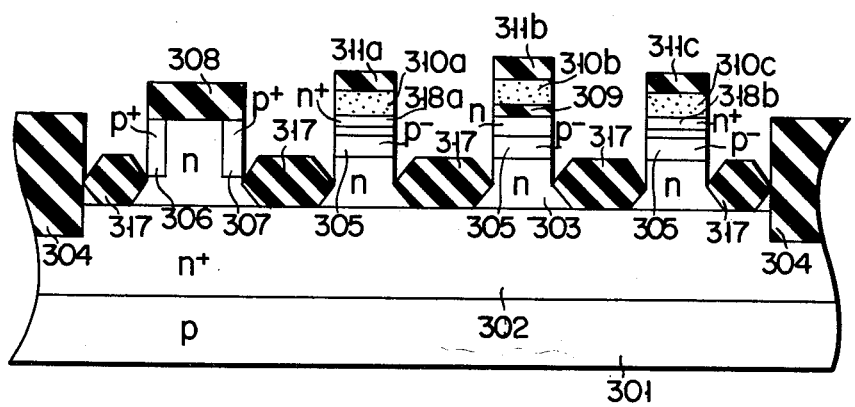

(iii) A silicon nitride film 316 (FIG. 5(c)) was deposited over the entire surface of the structure including etched parts 315. Etching was then performed by reactive ion etching for a time duration slightly longer than that required for entirely removing the silicon nitride film 316. Parts of the silicon nitride film 316 deposited on the side surfaces of the semiconductor regions 313a to 313c and so on have apparent thicknesses which are greater in the vertical direction than that at the flat part thereof. As is well known, reactive ion etching progresses only in the vertical direction of the substrate 301. For this reason, as shown in FIG. 5(d), silicon nitride films 316' remained on the side surfaces of the semiconductor regions 313a to 313c, the projection 314 and so on. At the same time, parts of the bottom surfaces of the etched parts 315 were exposed. Annealing was then performed in a steam or wet high-temperature atmosphere using as an antioxidant mask the silicon nitride film patterns 312a to 312c and the silicon nitride films 316'. Thus, silicon oxide layers 317 were grown on the bottom surfaces of the etched parts 315 between the semiconductor regions 313a to 313c. Upon annealing, arsenic in the n+-type polycrystalline silicon patterns 310a and 310c which were in direct contact with the n-type silicon epitaxial layer 303 was diffuzed into the n-type silicon epitaxial layer 303 to form n+-type collector regions 318a and 318b of the npn transistors. When these n+-type collector regions 318a and 318b are formed, the n+-type polycrystalline silicon patterns 310a and 310c serve as collector electrodes, and the n+-type polycrystalline silicon pattern 310b on the silicon oxide film 309 serves as a jumper wire. The silicon nitride films 316' and the silicon nitride film patterns 312a to 312c were removed with hot phosphoric acid (FIG. 5(e)).

Figure 5F:
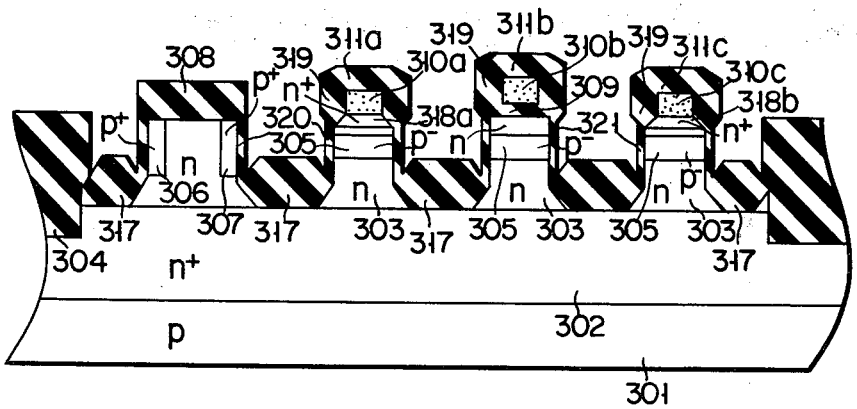
Figure 5G:
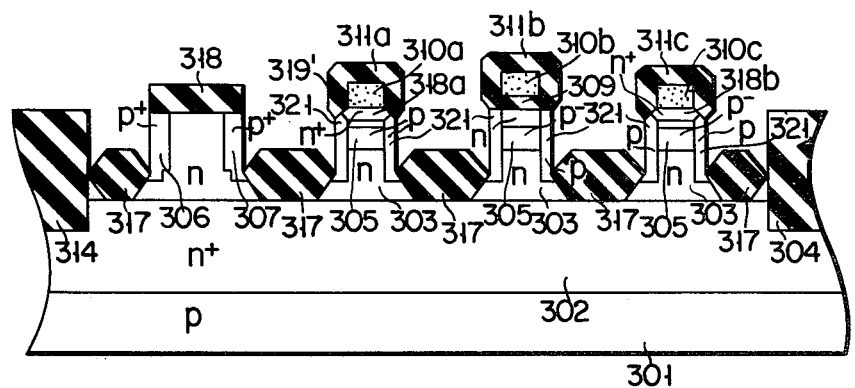
Figure 5H:
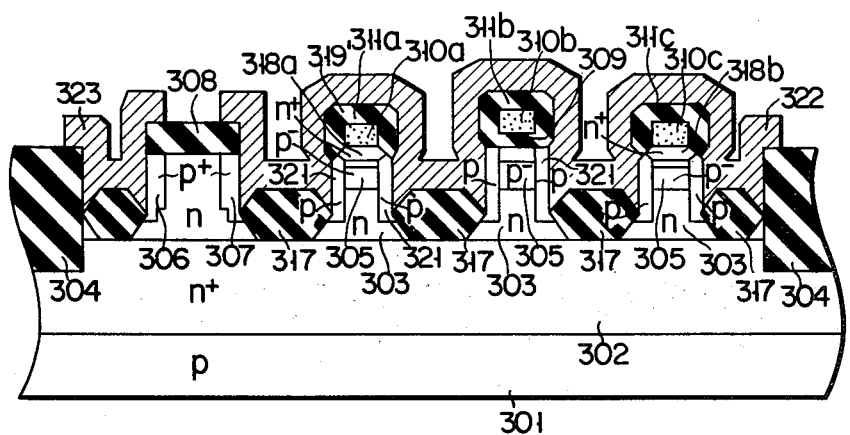

(iv) Annealing was performed in a steam or wet atmosphere at 700° to 900° C. The oxidation rate of the n+-type polycrystalline silicon patterns 310a to 310c and the n+-type collector regions 318a and 318b in the semiconductor regions 313a and 313c is 4 to 10 times that of the n-type silicon epitaxial layer 303 or the p⁻-type base regions 305 in the semiconductor regions 313a to 313c and the projection 314. For this reason, as shown in FIG. 5(f), thick thermal oxide films 319 were formed on the exposed side surfaces of the n+-type polycrystalline silicon patterns 310a to 310c and on the exposed side surfaces of the collector regions 318a and 318b in the semiconductor regions 313a and 313c. At the same time, thin thermal oxide films 320 were also formed on the exposed side surfaces of the silicon epitaxial layers 303 or p⁻-type base regions 305 and so on in the semiconductor regions 313a to 313c and the projection 314. The thin thermal oxide films 320 were removed by treatment with ammonium fluoride to leave thermal oxide films 319' around the n+-type polycrystalline silicon patterns 310a to 310c and the side surfaces of the collector regions 318a and 318b of the semiconductor regions 313a and 313c. Diffusion of boron or vapor phase diffusion of BN was performed to form p-type regions 321 (base contact regions) in the contact holes formed in the side surface of the semiconductor regions 313a to 313c and the projection 314 (FIG. 5(g)). The n+-type collector regions 318a and 318b of the semiconductor regions 313a and 313b with npn transistors and the surface of p-type regions (base contact regions) 321 were separated by the remaining thermal oxide films 319'. Therefore, a sufficient collector-base dielectric strength is obtained. Although the p-type regions 321 extend to parts of the n-type silicon epitaxial layers 303 below the p⁻-type base regions 305, they do not form big p-n junctions since most parts of the extended parts of the p-type regions 321 are in contact with the silicon oxide layers 317. Accordingly, the characteristics of the I²L are not adversely affected. After an aluminum film was formed over the entire surface of the structure by vapor deposition, it was patterned. Then, an injector electrode 323 was formed which was in contact with the p⁻-type emitter region (injector) 306. A base electrode 322 was also formed which was in contact with the p⁻-type base region 305. An I²L was thus completed (FIG. 5(h)).

The I²L manufactured in Example 3 above have the following advantages in addition to those of the I²L manufactured in Example 1.

Since the p⁻-type base regions 305 are exposed to the side surfaces of the semiconductor regions 313a and 313c, and the n+-type collector regions 318a and 318b, the collector-base dielectric strength can be improved. Furthermore, even if the base electrode 322 is formed in this condition, short-circuiting between the collector and the base through the electrode 322 can be prevented.

Figure 6:
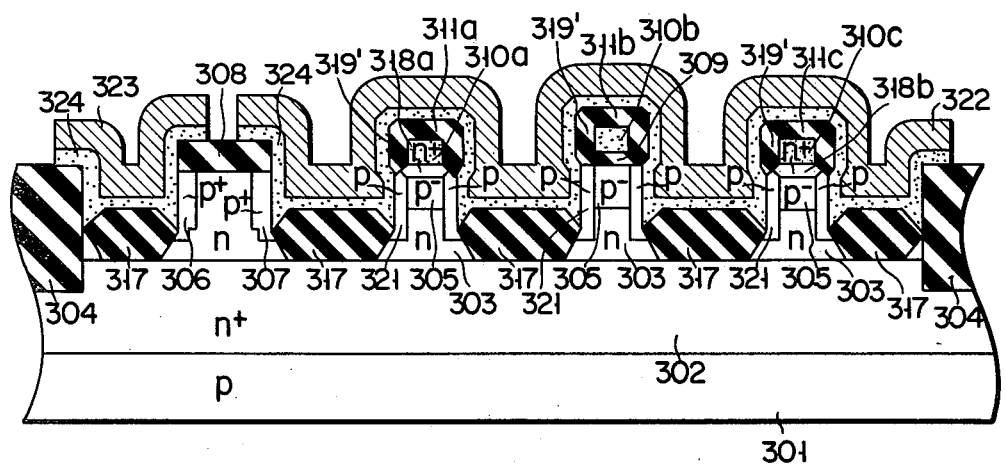
FIG. 6 is a sectional view showing an example of an I$^2$L manufactured by the method of the present invention.

In Example 3, after leaving the thermal oxide films 319' on the n+-type collector regions 318a and 318b of the semiconductor regions 313a and 313c, the p-type regions 321 are formed by thermal diffusion of boron. However, the present invention is not limited to this particular method. For example, the following procedure may be adopted. According to this alternative procedure, after leaving the thermal oxide films 319' on the n+-type collector regions 318a and 318b of the semiconductor regions 313a and 313b as shown in FIG. 6 and forming boron-doped polycrystalline silicon films 324 as a semiconductor film containing an impurity of second conductivity type over the entire surface of the structure, boron can be diffused from these boron-doped polycrystalline silicon films 324 through the contact holes formed in the side surfaces of the semiconductor regions 313a to 313c to form p-type regions 321' on the side surfaces of the semiconductor regions 313a to 313c. Then, the injector electrode 322 and the base electrode 323 may be formed with the polycrystalline silicon films 324 still remaining. If the silicon films 324 are left in this manner, they serve as barriers for the electrodes 322 and 323, so that short-circuiting between the base and the collector due to a punch through in the aluminum film or between the base and the emitter can be prevented. Thus, reliability of the I²L may be improved.

The present invention is not limited to the manufacture of I²L as in the examples described above. Thus, the present invention may be similarly applied to integrated circuits which have vertical npn transistors having second impurity regions of first conductivity type as emitters and free from parasitic collector-base junctions, or multi-functional integrated circuits including an I²L and npn transistors.

In summary, according to the present invention, semiconductor devices, for example bipolar semiconductor devices such as I²Ls may be mass-produced with ease wherein the crystal defects of the epitaxial layer are prevented, the depth of the base region of the vertical npn transistor is not particularly limited, the silicon oxide layer can be formed in self-alignment with the collector region of the transistor, and formation of a parasitic p-n junction is prevented.

What we claim is:

1. A method for manufacturing a semiconductor device comprising the steps of:
   (i) forming, in a surface layer or inside a semiconductor layer of first conductivity type, a first impurity region of second conductivity type, and thereafter forming a second impurity region of first conductivity type within said first impurity region or in part of said semiconductor layer on said first impurity region;
   (ii) etching part of said semiconductor layer excluding part thereof on at least said second impurity region to at least a depth of said first impurity region to form a semiconductor region, said semiconductor region including said first and second impurity regions and having a projecting shape with vertical or substantially vertical side surfaces, thus defining an etched part;
   (iii) selectively forming an insulating film on a bottom surface of the etched part; and
   (iv) forming an electrode on said semiconductor region, said electrode being connected to said first impurity region through the side surfaces of said semiconductor region;
wherein step (i) for forming said second impurity region comprises depositing, on part of said semiconductor layer on said first impurity region, a conductive pattern containing an impurity of first conductivity type to serve as an impurity diffusion source for said second impurity region and an electrode for said second impurity region; and step (ii) for etching the part of said semiconductor layer excluding the part on at least said second impurity region comprises etching the first mentioned part using said conductive pattern or an insulating film formed by the insulating treatment of the conductive pattern as a mask.

2. A method according to claim 1, wherein step (iii) comprises, prior to thermal oxidation, selectively forming an antioxidant insulating film on side surfaces of said semiconductor region formed in step (ii), and removing said antioxidant insulating film after thermal oxidation.

3. A method according to claim 2, wherein step (iii) further comprises, after removing said antioxidant insulating film, doping an impurity of second conductivity type to the side surfaces of said semiconductor region to form regions of second conductivity type.

4. A method according to claim 3, wherein said regions of second conductivity type on the side surfaces of said semiconductor region are formed by forming a semiconductor film containing the impurity of second conductivity type on at least the side surfaces of said semiconductor region and doping the impurity of second conductivity type using said semiconductor film as a diffusion source.

5. A method according to claim 1, wherein said second region of first conductivity type is used as one of an emitter and a collector of a vertical npn transistor.

6. A method according to any one of claims 1 to 5, wherein step (ii) further comprises an insulating treatment of said conductive pattern prior to etching.

7. A method according to any one of claims 1 to 5, wherein etching in step (ii) is performed in two substeps, said first substep comprising selectively etching to a depth of said second impurity region, and said second substep comprising forming an insulating film on the etched part formed in said first substep, selectively removing said insulating film on the bottom surface of said etched part to leave said insulating film on the side surfaces of said semiconductor region, and etching the bottom surface of said etched part to at least a depth of said first impurity region using the remaining part of said insulating film as a mask.

8. A method according to any one of preceding claims 1 to 5, wherein etching in step (ii) and formation of said insulating film in step (iii) are performed prior to the insulating treatment of said conductive pattern.

9. A method according to claim 8, wherein step (iii) further comprises, after formation of said insulating film, growing a thick oxide film around said conductive pattern and exposed side surfaces of said second impurity region of said semiconductor region below the side surfaces of said conductive pattern as well as growing a thin oxide film on exposed side surfaces of said first impurity region of said semiconductor region, etching said thin oxide film so as to form a contact hole in said first impurity region of said semiconductor region by self-alignment, and connecting said first impurity region with an electrode through said contact hole.

* * * * *